Figure 1:
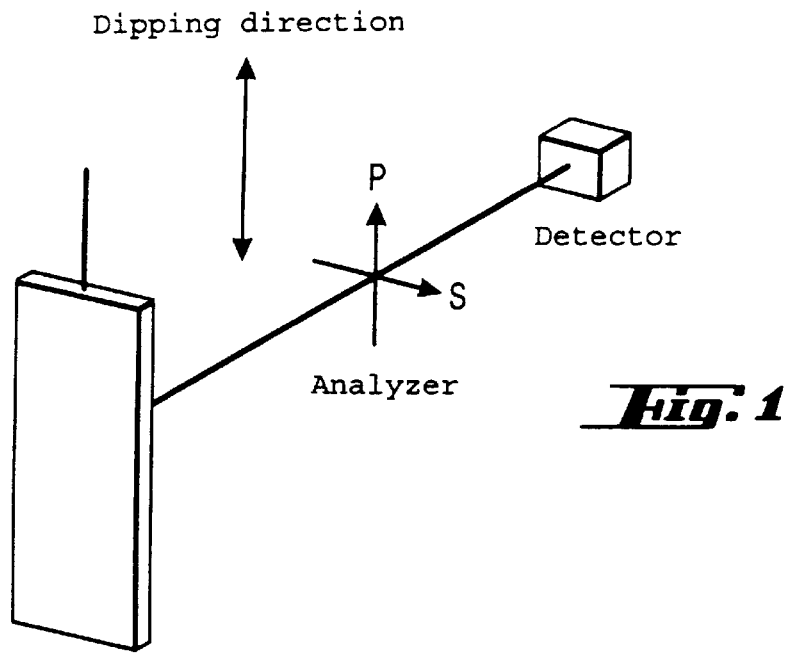

United States Patent [19]

Lupo et al.

[11] Patent Number: 6,040,069
[45] Date of Patent: Mar. 21, 2000

[54] ELECTROLUMINESCENE DEVICE WITH EMISSION OF POLARIZED LIGHT

[75] Inventors: Donald Lupo, Frankfurt; Marcus Remmers; Dieter Neher, both of Mainz, all of Germany

[73] Assignee: Hoechst Aktiengesellschaft, Frankfurt, Germany

[21] Appl. No.: 08/913,651
[22] PCT Filed: Mar. 20, 1996
[86] PCT No.: PCT/EP96/01202
  § 371 Date: Sep. 18, 1997
  § 102(e) Date: Sep. 18, 1997
[87] PCT Pub. No.: WO96/29376
  PCT Pub. Date: Sep. 26, 1996

[30] Foreign Application Priority Data

Mar. 20, 1995 [DE] Germany .......................... 195 09 450

[51] Int. Cl.[7] .................................................. H05B 33/14
[52] U.S. Cl. ........................... 428/690; 428/69; 428/917; 313/504; 345/36; 345/45; 345/76
[58] Field of Search ................................ 428/690, 691, 428/917; 313/504; 345/36, 45, 76

[56] References Cited

FOREIGN PATENT DOCUMENTS

WO 96/03015  2/1996  WIPO .

OTHER PUBLICATIONS

Advanced Materials, vol. 8, No. 2, 1996, pp. 146–149.
Synthetis Metals, vol. 71, No. 1–3, pp. 2121–2124.
Advanced Materials, vol. 7, No. 11, 1995, pp. 923–925.
Abstract of JP–A–03/043991.

*Primary Examiner*—Charles Nold
*Attorney, Agent, or Firm*—Frommer Lawrence & Haug LLP

[57] ABSTRACT

The invention relates to an electroluminescence device having at least one light-emitting layer which comprises conjugated, stiff-chain polymers which are soluble in organic solvents, wherein the emitted electroluminescence is polarized and the intensity of the light which is polarized parallel to the longitudinal axis of the substrate is at least three times the intensity polarized perpendicular thereto.

10 Claims, 1 Drawing Sheet

ELECTROLUMINESCENE DEVICE WITH EMISSION OF POLARIZED LIGHT

There is a great industrial need for large-area solid-state light sources for a range of applications, predominantly in the field of display elements, VDU technology and light engineering. The demands made of these light sources can at present not be met completely satisfactorily by any of the existing technologies.

As an alternative to conventional display and/or lighting elements such as incandescent lamps, gas discharge lamps and non-self-illuminating liquid crystal display elements, use has for some time been made of electroluminescence (EL) materials and devices such as light-emitting diodes (LEDs).

Apart from inorganic electroluminescence materials and devices, low molecular weight, organic electroluminescence materials and devices have been known for about 30 years (see, for example, U.S. Pat. No. 3,172,862). However, until recently such devices have been greatly restricted in their practical usability.

WO 90/13148 and EP-A 0 443 861 describe electroluminescence devices comprising a film of a conjugated polymer as light-emitting layer (semiconductor layer). Such devices offer numerous advantages such as the opportunity to produce large-area, flexible displays simply and inexpensively. Such displays are self-illuminating and therefore require no additional backward lighting source. Unstructured electroluminescence devices can also be used as background lighting source in liquid crystal displays. In contrast to conventional devices having a lighting tube and a light scattering grating, such devices offer advantages in respect of thickness and weight. However, owing to the random distribution of the main polymer chains, the light emitted from electroluminescence devices is not polarized.

However, particularly in the field of display elements, emission of polarized light is of particular importance. The background lighting of conventional LCD displays, e.g. in VDUs for computers, has to be polarized. If the emitted light is itself polarized, a polarizing film with its associated intensity losses can be omitted.

A typical electroluminescence device as described in WO 90/13148 comprises a light-emitting layer in the form of a thin, coherent polymer film (semiconductor layer) comprising at least one conjugated polymer. A first contact layer is in contact with a first surface of the semiconductor layer and a second contact layer is in contact with a further surface of the semiconductor layer. The polymer film of the semiconductor layer has a sufficiently low concentration of extrinsic charge carriers for charge carriers to be introduced into the semiconductor layer on application of an electric field between the two contact layers, so that one contact layer becomes positive compared with the other and the semiconductor layer emits radiation.

The polymers used in such devices are generally conjugated. For the purposes of the present invention, a conjugated polymer is a polymer which has a delocalized electron system along the main chain. The delocalized electron system gives the polymer semiconductor properties and enables it to transport positive and/or negative charge carriers with high mobility.

Polarized electroluminescence on polymer films has been observed on stretched polythiophene (P. Dyreklev, M. Berggren, O. Inganäs, M. R. Andersson, O. Wennerström, T. Hjertberg, Adv. Mat. 1995, 7, 43). The ratio of light polarized in parallel and perpendicular directions was 2.4. However, in this method it is not possible to set an exact film thickness and homogeneity and cracks can occur in the polymer film as a result of the mechanical stretching process.

The building up of the light-emitting layers by means of conventional techniques such as spin coating (see, for example H. Frey, G. Kienel, Dünnschichttechnologie, VDI Verlag, Düsseldorf, 1987) results in a virtually isotropic orientation of the conjugated polymers in relation to the substrate surface. The emitted radiation can therefore also have no preferential polarization.

Up to now, it has been possible, by means of the Langmuir-Blodgett (LB) technique, to transfer only amphiphilic materials which have no chain stiffness and therefore also have no high degree of orientation in the finished film (see, for example, G. Roberts, "Langmuir-Blodgett Films", Plenum, New York, 1990). Thus, polyimides and poly(phenylene-vinylene) precursor polymers have already been used in electroluminescence devices (EP-A-0 237 017).

G. Wegner, Thin Solid Films 1992, 216, 105, describes stiff-chain polymers having solubilizing alkyl side chains, e.g. polyglutamates, celluloses, phthalocyanines or poly(p-phenylenes), as a new class of substances which form Langmuir-Blodgett films. In such polymer films, the polymer molecules are aligned parallel to the substrate and display anisotropic behavior in respect of various physical properties. The surfaces of such LB films are very homogeneous and the thickness of the layers can be set very accurately.

The maximum anisotropies of the photoluminescence which have hitherto been able to be achieved using conjugated, stiff-chain polymers (poly(p-phenylene)) in Langmuir-Blodgett films are in the region of 2.6 (T. Vahlenkamp, G. Wegner, Makromol. Chem. Phys. 1994, 195, 1933; T. Vahlenkamp, thesis, Mainz 1992).

It is an object of the present invention to provide an electroluminescence device which, when used in lighting an/or display devices, is able to improve the property profile of previous devices.

It has surprisingly been found that building up, layer by layer, suitable, highly ordered polymer layers enables the production of electroluminescence devices which make possible the emission of radiation having a parallel polarization, with the degree of polarization of the light from these devices considerably exceeding the previously known values. The light emitted by the emitter molecules here has considerable anisotropies of the polarization direction parallel and perpendicular to the longitudinal axis of the layer.

The invention accordingly provides an electroluminescence device comprising a light-emitting layer which comprises at least one polymer, wherein the emitted electroluminescence is polarized and the polarization ratio is at least three, preferably at least four.

The polymer is preferably a conjugated or partially conjugated polymer, particularly preferably a conjugated, stiff-chain polymer which is soluble in organic solvents.

The intensity of the light which is polarized parallel to the longitudinal axis of the substrate is preferably at least three times, particularly preferably at least four times, the intensity polarized perpendicular thereto.

The polarization ratio is measured by means of an analyzer (polarization filter) fitted so as to be able to rotate, by determining the intensity of the emitted light as a function of the rotation angle of the analyzer. The polarization ratio is defined as the ratio of the maximum and minimum measured intensities.

To produce the electroluminescence device of the invention, the light-emitting layer is preferably built up monolayer by monolayer by means of liquid-gas interface transfer methods (e.g. using the Langmuir-Blodgett technique) (see, for example B. A. Ulman, An Introduction to Ultrathin Organic Films, Acad. Press, Boston, 1991). When using suitable substances, these layer systems have a high degree of molecular order.

Suitable polymers for such applications are soluble, conjugated, stiff-chain polymers, e.g. built up of arylene or heteroarylene units, also in combination with unsaturated units (e.g. PPP, PPV, PT). Such substances can be made processable from solution by the incorporation of flexible side chains into the polymer. For the purposes of the present invention, stiff-chain polymers are those in which, as a result of the structure, the backbone has to assume a predominantly linear configuration.

"Soluble in organic solvents" means, in the context of the invention, that the polymer can be dissolved in a concentration of at least 0.3 mg/ml at 20° C. in at least one water-immiscible organic solvent or a mixture of such solvents.

Surprisingly, the electroluminescence device of the invention can be produced by direct build-up of the light-emitting layer without a subsequent modification such as stretching being necessary.

The invention therefore also provides an abovementioned electroluminescence device obtainable by direct build-up of the light-emitting layer.

A preferred soluble, conjugated, stiff-chain polymer is a polymer which comprises oligo-p-phenylene units and comprises at least one structural element of the formula $(A_kB_l)_n$, where the symbols and indices have the following meanings:

A are identical or different units

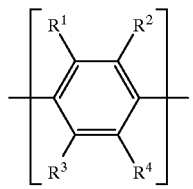

B are identical or different units

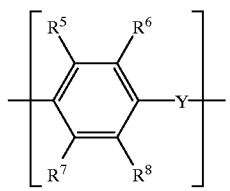

Y are identical or different and are each (E) —$CR^9$=$CR^{10}$—, —C=C— or —$CHR^{11}$—$CHR^{12}$;

$R^1$, $R^2$, $R^3$, $R^4$, $R^5$, $R^6$, $R^7$, $R^8$, $R^9$, $R^{10}$, $R^{11}$, $R^{12}$ are, independently of one another, identical or different in the individual structural elements and are each H, a straight-chain or branched alkyl group having from 1 to 22 carbon atoms, where one or more non-adjacent $CH_2$ groups can also be replaced by —O—, —S—, —$SO_2$—, —COOC—, —OOC— and/or phenylene, preferably 1,4-phenylene, or an aryl or aryloxy group, preferably having from 4 to 14 carbon atoms, in which the aromatic unit may be substituted by $C_1$–$C_{22}$-alkyl, $C_1$–$C_{22}$-alkoxy, Br, Cl, F and/or CN, or Br, Cl, F, CN or alkyloxycarbonyl having from 2 to 23 carbon atoms;

k is from 0 to 25;
l is from 0 to 25, where the sum k+l≧1;
n is from 1 to 200;
where the sum of all n is in the range from 3 to 200.

Preference is given to polymers in which l is 0 or Y is —$CHR^{11}$—$CHR^{12}$—, particularly preferably those in which l is 0.

Furthermore, preference is given to polymers in which $R^{11}$ and $R^{12}$ are H.

Likewise preferred are polymers in which one or two, preferably two, particularly preferably located in the 2 and 5 positions, radicals $R^1$, $R^2$, $R^3$, $R^4$ or $R^5$, $R^6$, $R^7$, $R^8$ are each an alkyl group having from 2 to 22 carbon atoms, where preferably one or more, particularly preferably one, $CH_2$ groups are each replaced by a heteroatom which may be substituted by a further aliphatic or aromatic hydrocarbon radical having preferably from 1 to 22 carbon atoms and a further $CH_2$ group may be replaced by a substituted or unsubstituted phenylene group and where the remaining radicals $R^1$ to $R^8$ are H.

Preferred heteroatoms are —O—, —S— and —$NR^{13}$—, where $R^{13}$ is as defined for $R^1$ to $R^{12}$. The particularly preferred heteroatom is —O—.

Very particularly preferably, $R^1$, $R^4$, $R^5$ and $R^8$ are identical or different and are each a straight-chain or branched alkoxy group having from 1 to 22 carbon atoms.

Most preferred are polymers described by the formulae (A) and (B) in which $R^2$, $R^3$, $R^6$, $R^7$, $R^9$ and $R^{10}$ are hydrogen and in which $R^1$=$R^4$ and $R^5$=$R^8$ and are each a straight-chain or branched alkoxy group having from 4 to 7 carbon atoms.

The indices k, l are preferably each a natural number in the range from 1 to 13, particularly preferably 1, 2 or 3, very particularly preferably 2 or 3.

A polymer used according to the invention preferably consists of structural elements of the formula $(A_kB_l)_n$.

It is preferred here that the polymer chain contains only one structural element of the formula $(A_kB_l)$ having a particular k and l. The index n is then preferably in the range from 5 to 75.

Likewise preferably, the polymers of the invention can have a plurality of different structural elements of the formula $(A_kB_l)$. It should be noted here that the structural element A can be varied not only by means of the radicals $R^1$ to $R^4$, but also by means of the indices k and l.

In such cases, preference is given to random copolymers as are represented by the formula $[(A^1_kB^1_l)_{0.x}(A^2_kB^2_l)_{0.y} \ldots (A^n_kB^n_l)_{0.n}]_m$ where $0.x+0.y \ldots +0.n=1$ and $3 \leq m \leq 200$. Such random copolymers preferably contain from 2 to 8 different structural elements of the formula $(A_kB_l)$.

Likewise preferred are block copolymers of the formula $[(A^1_kB^1_l)_x(A^2_kB^2_l)_y - \ldots (A^n_kB^n_l)_n]_m$, where $3 \leq m \leq 200$. Preference is given here to block copolymers containing two different structural elements of the formula $(A_kB_l)$. x and y are preferably in the range from 1 to 199, particularly preferably from 2 to 50, where x+y≦200.

In the presence of a plurality of different structural elements of the formula $(A_kB_l)_n$, each individual element can have a value of n in the range from 1 to 200, with the proviso that the sum of all n is in the range from 3 to 200, preferably in the range from 5 to 75.

The polymers used according to the invention can be prepared by various methods. The preparation can be carried out by methods known per se from the literature, as are described in standard works on organic synthesis, e.g. Houben-Weyl, Methoden der Organischen Chemie, Georg-Thieme-Verlag, Stuttgart. The preparation is carried out here under reaction conditions which are known and suitable for the reactions mentioned. Use can also be made of variants which are known per se and are not mentioned in more detail here.

For example, derivatives of benzene and of stilbene can be polymerized oxidatively (e.g. using $FeCl_3$, see, inter alia, P. Kovacic, N. B. Jones, Chem. Ber. 1987, 87, 357; M. Wede, T. Abe, H. Awano, Macromolecules 1992, 25, 5125) or electrochemically (see, for example, N. Saito, T. Yamamoto, Polym. Bull. 1993, 30, 285).

Likewise, the polymers can be synthesized from dihalo aromatics using copper/triphenylphosphine catalysis (see, for example, G. W. Ebert, R. D. Rieke, J. Org. Chem. 1988, 53, 4482) or nickel/triphenylphosphine catalysis (see, for example, H. Matsumoto, S. Inaba, R. D. Rieke, J. Org. Chem. 1993, 48, 849).

Aromatic distannanes can be polymerized using palladium catalysis, as indicated, for example, in J. K. Stille, Angew. Chem., Int. Ed. Engl. 1986, 25, 508.

Furthermore, aromatic dibromo compounds can be converted into the dilithio or di-Grignard compounds which are then polymerized with a further dibromo compound by means of $CuCl_2$ (see, for example, G. Wittig, G. Klar, Liebigs Ann. Chem. 1967, 704, 91; H. A. Staab, F. Bunny, Chem. Ber. 1967, 100, 293; T. Kaufmann, Angew. Chem. 1974, 86, 321) or by electron transfer of unsaturated 1,4-dihalo compounds (see, for example, S. K. Taylor, S. G. Bennet, K. J. Harz, L. K. Lashley, J. Org. Chem. 1981, 46, 2190).

In addition, the polymers can be polymerized by reaction of the dibromo compounds mentioned with nickel catalysts in the presence of 2,2'-bipyridines (see K. Chmil, U. Scherf, Makromol. Chem., Rapid Commun. 1993, 14, 217).

However, preference is given to a process which comprises reacting one or more compounds of the formula (I)

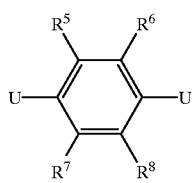

(I)

with one or more compounds of the formula (II) and/or (III)

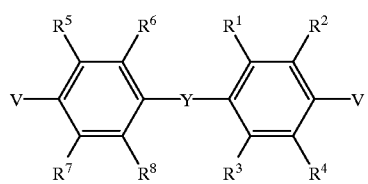

(II)

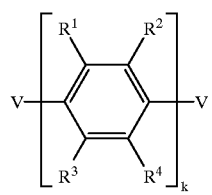

(III)

in an inert organic solvent or solvent mixture in the presence of at least one palladium-containing compound and, if desired, an additional substance, where the symbols and indices in the formulae (I) to (III) have the following meanings:

U and V are different from one another and are each a halogen selected from the group consisting of I, Br and Cl, preferably Br, or $BQ_1Q_2$;

$Q_1$, $Q_2$ are identical or different and are —OH, $C_1$–$C_{10}$-alkoxy, $C_1$–$C_{10}$-alkyl, phenyl which may be substituted by $C_1$–$C_{10}$-alkyl, $C_1$–$C_{10}$-alkoxy or halogen; or halogen or $Q_1$ and $Q_2$ together form a $C_1$–$C_4$-alkylenedioxy group, a methylene group which may be substituted by one or two $C_1$–$C_4$-alkyl groups; or $Q_1$ and $Q_2$ and the boron atom are together part of a boroxane ring of the formula (IV)

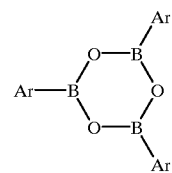

(IV)

Ar is an aromatic radical of the formula (I), (II) or (III);

Y are identical or different and are each (E) —$CR^9$=$CR^{10}$—, —C=C— or —$CHR^{11}$—$CHR^{12}$;

$R^1$, $R^2$, $R^3$, $R^4$, $R^5$, $R^6$, $R^7$, $R^8$, $R^9$, $R^{10}$, $R^{11}$, $R^{12}$ are, independently of one another, identical or different in the individual structural elements and are each H, a straight-chain or branched alkyl group having from 1 to 22 carbon atoms, where one or more non-adjacent $CH_2$ groups can also be replaced by —O—, —S—, —$SO_2$—, —COOC—, —OOC— and/or phenylene, preferably 1,4-phenylene, or an aryl or aryloxy group, preferably having from 4 to 14 carbon atoms, in which the aromatic unit may be substituted by $C_1$–$C_{22}$-alkyl, $C_1$–$C_{22}$-alkoxy, Br, Cl, F, CN and/or $NO_2$, or Br, Cl, F, CN, $NO_2$ or alkyloxycarbonyl having from 2 to 23 carbon atoms;

k is from 1 to 25, preferably from 1 to 13, particularly preferably 1, 2 or 3, in particular 2 or 3.

It is advantageous to react approximately equimolar amounts of the boronic acid (ester) and the halogen compound. Preference is given to reacting the boronic acid (ester) in a 1.001- to 1.1-fold excess, particularly preferably a 1.025-fold excess.

The reaction is generally carried out at a temperature in the range from 0 to 150° C., preferably from 20 to 100° C. and particularly preferably from 70 to 90° C. The reaction time is generally from one hour to usually 3 to 5 days.

Preferred solvents are mixtures whose components are miscible or immiscible, preferably immiscible, under the reaction conditions. For the first component, preference is given to a polar protic solvent such as water. As a further component, preference is given to N,N-dialkylamides such as dimethylformamide (DMF), N-methyl-2-pyrrolidone, ethers such as tetrahydrofuran (THF), aromatic hydrocarbons such as toluene and mixtures of the solvents mentioned. Particular preference is given to a binary mixture of THF and water, in particular in a ratio of 1:1.

Compounds containing palladium display catalytic activity for the polymerization reaction. Preference is given to compounds containing palladium in the oxidation state 0 or form palladium(0) species under the reaction conditions; particular preference is given to tetrakis (triphenylphosphine)palladium (0) which can be used directly. In general, use is made of a concentration of 1 mol % of catalyst per mole of monomers used. As additional substance, use is generally made of weak bases, preferably sodium hydrogen carbonate in a concentration of 1 mol/l based on the amount of water used.

To prepare random copolymers, it is possible, for example, to copolymerize different compounds of the formula (I) and (II) or (I) and (III) or (I) and (II) and (III).

Various bromo derivatives (U or V is Br) can also be coupled to form random copolymers, e.g. as indicated above using $Ni^0$ catalysis.

To prepare block copolymers, the procedure is, for example, to react a halogen component with a sufficiently large excess of a boronic acid (ester) component so as to form oligomers having a defined length and having terminal boronic acid (ester) groups. A second block is produced by reacting a boronic acid (ester) component with an appropriate excess of a halogen component; the oligomers of this second block have terminal halogen functions. Alternatively, such terminated oligomers can also be built up by boration of bromine-terminated oligomers. Reaction of the two blocks in a ratio of 1:1 leads to the block copolymers of the invention.

A further possible way of interrupting the conjugation along the main polymer chain comprises the defined use of monomers which have 1,3-dibromo substitution. The resulting polymer has a corresponding kink which effectively suppresses the conjugation.

This monomer is used in place of the corresponding dibromostilbene monomer in such a way that the approximately equimolar ratio of dibromo compound to diboronic acid is not changed.

The work-up is carried out by the known methods with which those skilled in the art are familiar. For example, the reaction mixture can be poured into methanol, filtered, washed with water, extracted and the crude product obtained can be further purified by reprecipitation.

The monomer building blocks of the formulae (I) to (III) can be prepared by literature methods known per se, as are described in standard works on organic synthesis, e.g. Houben-Weyl, Methoden der Organischen Chemie, Georg-Thieme-Verlag, Stuttgart. The preparation is carried out under reaction conditions which are known and suitable for the reactions mentioned. Use can also be made of variants which are known per se and are not described in more detail here.

Methods of synthesizing substituted 1,4-dibromobenzenes or further 1,4-dihalo compounds are known as standard reactions (see, for example, J. March, Advanced Organic Chemistry, 4th edition, pp. 531–534, John Wiley & Sons, New York 1992).

1,4-Dibromoalkylbenzenes can be prepared, for example, by alkylation of 1,4-dihalobenzenes by a Grignard reaction and subsequent regioselective bromination in the 2 and 5 positions.

1,4-Dibromo (pseudo)halogen compounds are obtainable, for example, from the corresponding dibromides by replacement with, for example, cyano groups (M. Rehahn, A.-D. Schlüter, W. J. Feast, Synthesis 386, 1988).

Correspondingly, numerous ways of synthesizing oligo-p-phenylene and stilbene derivatives can also be employed.

Oligo-p-phenylenes can, for example, be built up from the corresponding monomers by the abovementioned methods.

Stilbene derivatives can be synthesized, for example, by the methods described in Houben-Weyl, Methoden der Organischen Chemie, Georg-Thieme-Verlag, Stuttgart (e.g. Wittig reaction, Knoevenagel reaction, Heck reaction).

The abovementioned polymers can also be used as mixtures. Surprisingly, polymers having l=0 or Y= —$CHR^{11}$—$CHR^{12}$— are also able to form LB films when used together with additives which on their own do not readily, if at all, form LB films.

Preference is given to using polymers having l=0 or Y= —$CHR^{11}$—$CHR^{12}$— in a mixture with polymers in which Y is —C≡C— or —$CR^9$=$CR^{10}$—.

In the mixtures, up to 50% of the total amount can be additive; the amount of additive is preferably not more than 30% of the total amount. Possible additives are not only polymers but also low molecular weight, anisotropic dye molecules. The introduction of the additives can be carried out by cospreading, likewise by subsequent introduction of the additive, preferably a dye, into the finished film.

The general structure of electroluminescence devices is described, for example, in U.S. Pat. No. 4,539,507 and U.S. Pat. No. 5,151,629. Polymer-containing electroluminescence devices are described, for example, in WO 90/13148 and EP-A 0 443861.

The electroluminescence device of the present invention is produced by known methods with which those skilled in the art are familiar.

In a preferred embodiment, the electroluminescence material, preferably one or more of the above-described polymers, is built up monolayer by monolayer by means of liquid-gas interface transfer methods. Such methods are described, for example, in A. Ulman, An Introduction to Ultrathin Organic Films, Acad. Press, Boston, 1991.

Particular preference is given to application by the Langmuir-Blodgett technique which is comprehensively described in A. Ulman, loc. cit., chapter 2. A further description of this method and references on the subject may be found in Ullmann's Encyclopaedia of Technical Chemistry, 5th ed., Verlag Chemie, Weinheim 1985 under the keyword thin films.

In the customary method of producing LB layers, amphiphilic molecules which are not water-soluble are spread in the form of a dilute solution (typically <1 g/l) in a volatile solvent (e.g. methylene chloride) onto a water surface in a coating apparatus, e.g. a Langmuir trough. After evaporation of the solvent, the molecules are compressed by reduction of the water surface available to them to form a cohesive film until a compression state suitable for transfer of the film is reached. The reduction in the surface area is achieved by moving a solid barrier or by adjusting a closed flexible band which encloses the amphiphilic molecules on the water surface. However, the compression can also be carried out via rotating rollers (Barraud et al., Thin Solid Films 1983, 99, 221) or flow of the water (U.S. Pat. No. 4,722,856, EP-A-0 433 325 or EP-A-0 583 676). The transfer of the film from the water surface to a support is carried out by dipping in the support through the film-covered water surface or taking out. In particular, it is possible to transfer multiple layers by repeating the dipping procedures, with one monomolecular layer being transferred per dip.

The electroluminescence device of the invention usually comprises an electroluminescent layer between a cathode and an anode, with at least one of the electrodes being transparent. In addition, an electron injection and/or electron transport layer can be introduced between the electroluminescent layer and the cathode and/or a hole injection and/or hole transport layer can be introduced between the electroluminescent layer and the anode. As cathode, it is possible to use, for example, Ca, Mg, Al, Mg/Al. As anode, it is possible to use, for example, Au or ITO (indium oxide/tin oxide) on a transparent substrate, e.g. of glass or a transparent polymer. In operation, the cathode is placed at a negative potential compared with the anode. Electrons from the cathode are thus injected into the electron injection layer/ electron transport layer or directly into the light-emitting layer. At the same time, holes from the anode are injected into the hole injection layer/hole transport layer or directly into the light-emitting layer.

The injected charge carriers move toward one another through the active layers under the action of the applied potential. This leads to electron/hole pairs at the interface between charge transport layer and light-emitting layer or within the light-emitting layer and these recombine with emission of light. The color of the emitted light can be varied by means of the compound used as light-emitting layer.

Electroluminescence devices are used, for example, as self-illuminating display elements such as control lamps, alphanumeric displays, signs and in optoelectronic couplers.

Preference is given to using them as background lighting for liquid crystal displays.

The subject matter of the documents cited in the description and examples is incorporated by reference into the description.

The invention is illustrated by the examples, without being restricted thereby.

EXAMPLE 1

A quartz glass support is first rubbed down with acetone, precleaned for 15 minutes in methylene chloride in an ultrasonic bath, treated for 30 minutes in a reaction solution consisting of 10% of hydrogen peroxide (30% strength), 40% of aqueous concentrated ammonia solution and 50% of milli-Q water (deionized water having a conductivity of 0.5 $\mu$S/cm) and subsequently washed for 10 minutes in a stream of milli-Q water. 2 mm wide strips of first chromium (4 nm) and subsequently gold (17 nm) are vapor-deposited onto the support at $2\times10^{-5}$ mbar. The glass support prepared in this way is treated in an argon plasma at 1 mbar for 5 minutes and subsequently hydrophobicized for 30 minutes in a 30% strength solution of hexamethyldisilazane in chloroform.

The film transfer is carried out by means of a Lauda film balance FW-1 which is installed on a granite slab in a laminar flow box. Coating is carried out with automatic maintenance of a constant film pressure. The subphase used is milli-Q water and the temperature of the subphase is controlled by means of a thermostat connected to the film balance. To apply the polymer layer as a Langmuir-Blodgett film, 1 mg of poly(p-2,5-diisopentyloxy-phenylene) ($M_w$=10,000) is dissolved in 3 ml of chloroform. The polymer is prepared as described in M. Rehan, A. D. Schlüter, G. Wegener, J. Peast, Polymer 1989, 30, 1060; Th. Valenkamp, G. Wegener, Macromol. Chem. Phys. 1994, 195, 1933 and V. Cimova, M. Remmers, D. Neher, G. Wesner, Adv. Matter 1995 (in press). At a subphase temperature of 6° C., 30 drops of the polymer solution are carefully placed on the water surface. The polymer film is compressed to a pressure of 8 mN/m. After a delay time of 30 minutes, the prepared glass support is dipped at a speed of 1 cm/min into the LB trough to a depth of 2 cm and after a delay time of 10 seconds is lifted out again. The delay time to the commencement of a new cycle is 5 minutes. In this way, 100 monolayers of the polymer are applied in 50 cycles. The transfer rate of the polymer from the water surface to the glass support is detected by means of the movement of the barriers.

Figure 2:
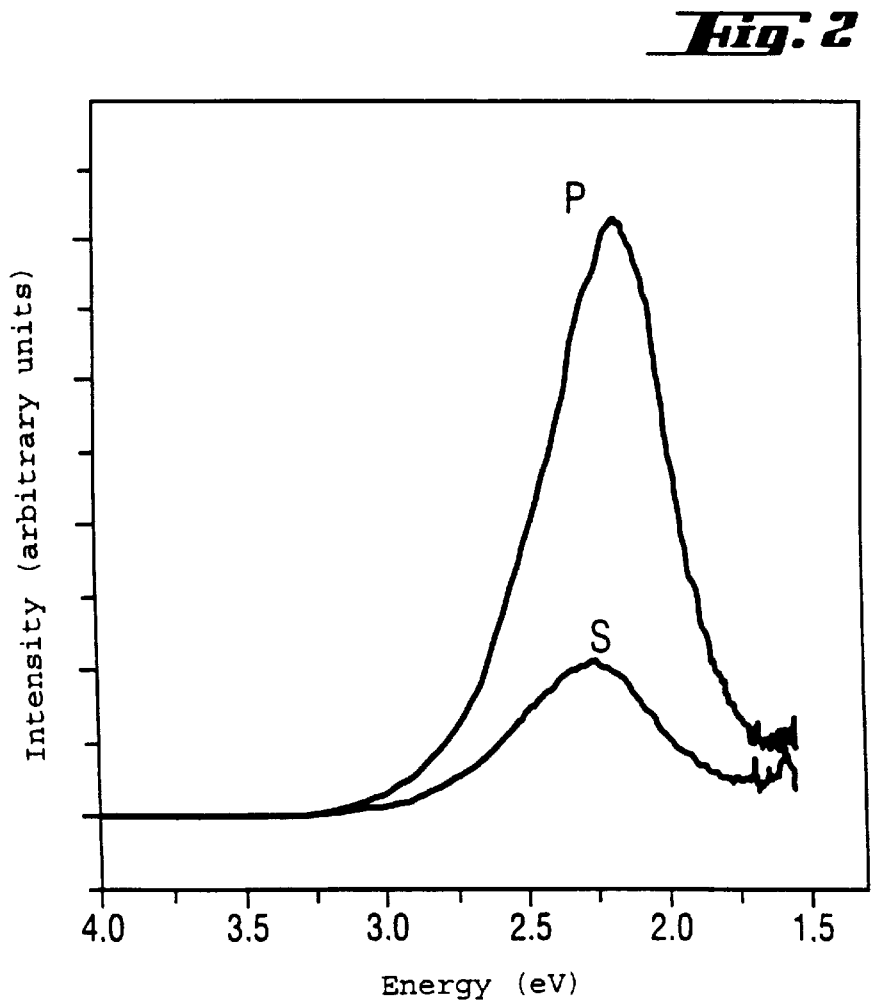

Subsequently, at $2\times10^{-5}$ mbar, Al is applied in 2 mm wide strips perpendicular to the gold coating. The resulting device Au/polymer/Al is placed in a specimen holder and the electrodes are connected to a source of electric power with the Au strips being given a positive polarity and the Al strips a negative polarity. On application of a field of $15\times10^7$ V/m, an intense, homogeneous, polarized white electroluminescence from the corresponding matrix element is observed. The intensity of the light which is polarized parallel to the longitudinal axis of the substrate is four times the intensity polarized perpendicular thereto (cf. FIGS. 1 and 2).

EXAMPLE 2

The substrate used is a glass support coated with indium tin oxide (ITO), with the width of the ITO strips being 2 mm. This glass support is cleaned with isopropanol and subsequently hydrophobicized for 30 minutes in a 30% strength solution of hexamethyldisilazane in chloroform. The film transfer is carried out by means of a Lauda film balance FW-1 which is installed on a granite slab in a laminar flow box. Coating is carried out with automatic maintenance of a constant film pressure. The subphase used is milli-Q water and the temperature of the subphase is controlled by means of a thermostat connected to the film balance. To apply the polymer layer as a Langmuir-Blodgett film, 1 mg of poly (p-2,5-diisopentyloxy-phenylene) ($M_w$=10,000) is dissolved in 3 ml of chloroform. At a subphase temperature of 6° C., 30 drops of the polymer solution are carefully placed on the water surface. The polymer film is compressed to a pressure of 8 mN/m. After a delay time of 30 minutes, the prepared glass support is dipped at a speed of 1 cm/min into the LB trough to a depth of 2 cm and after a delay time of 10 seconds is lifted out again. The delay time to the commencement of a new cycle is 5 minutes. In this way, 100 monolayers of the polymer are applied in 50 cycles. The transfer rate of the polymer from the water surface to the glass support is detected by means of the movement of the barriers.

Subsequently, at $2\times10^{-5}$ mbar, Al is applied in 2 mm wide strips perpendicular to the ITO coating. The resulting device ITO/polymer/Al is placed in a specimen holder and the electrodes are connected to a source of electric power with the ITO strips being given a positive polarity and the Al strips a negative polarity. On application of a field of 15×107 [sic] V/m, an intense, homogeneous, polarized white electroluminescence from the corresponding matrix element is observed. The intensity of the light which is polarized parallel to the longitudinal axis of the substrate is four times the intensity polarized perpendicular thereto.

COMPARATIVE EXAMPLE

The substrate used is a glass support coated with indium tin oxide (ITO), with the width of the ITO strips being 2 mm. This glass support is cleaned in isopropanol. To apply the polymer film, 20 mg of poly(p-2,5-diisopentyl-oxyphenylene) ($M_w$=10,000) are dissolved in 2 ml of chlorobenzene. This solution is used for spin coating the support at a rotation rate of 1000 rpm. The resulting layer thickness is about 50 nm.

Subsequently, at $2\times10^{-5}$ mbar, Al is applied in 2 mm wide strips perpendicular to the ITO coating. The resulting device ITO/polymer/Al is placed in a specimen holder and the electrodes are connected to a source of electric power with the ITO strips being given a positive polarity and the Al strips a negative polarity. On application of a field of 15×107 V/m, an intense, homogeneous, polarized [sic] white electroluminescence from the corresponding matrix element is observed; this electroluminescence has no polarization.

I claim:

1. An electroluminescence device comprising a light-emitting layer which comprises at least one polymer, wherein the emitted electroluminescence is polarized and the polarization ratio is at least three.

2. An electroluminescence device as claimed in claim 1 obtainable by direct build-up of the light-emitting layer.

3. An electroluminescence device as claimed in claim 2, wherein the light-emitting layer is built up by means of liquid-gas interface transfer methods.

4. An electroluminescence device as claimed in claim 3, wherein the liquid-gas interface transfer method used is the Langmuir-Blodgett technique.

5. An electroluminescence device as claimed in claim 4, wherein the polymer comprises at least one structural element of the formula $(A_kB_l)_n$, where the symbols and indices have the following meanings:

A are identical or different units

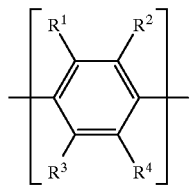

B are identical or different units

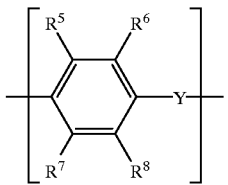

Y are identical or different and are each (E) —CR$^9$=CR$^{10}$—;

$R^1, R^2, R^3, R^4, R^5, R^6, R^7, R^8, R^9, R^{10}$ are, independently of one another, identical or different in the individual structural elements and are each H, a straight-chain or branched alkyl group having from 1 to 22 carbon atoms, where one or more non-adjacent CH$_2$ groups can also be replaced by —O—, —S—, —SO$_2$—, —COOC—, —OOC— and/or phenylene, preferably 1,4-phenylene, or an aryl or aryloxy group, preferably having from 4 to 14 carbon atoms, in which the aromatic unit may be substituted by C$_1$–C$_{22}$-alkyl, C$_1$–C$_{22}$-alkoxy, Br, Cl, F and/or CN, or Br, Cl, F, CN or alkyloxycarbonyl having from 2 to 23 carbon atoms;

k is from 0 to 25;

l is from 0 to 25, where the sum k+l≧1;

n is from 1 to 200, where the sum of all n is in the range from 3 to 200.

6. An electroluminescence device as claimed in claim 1, wherein the polymer comprises at least one structural element of the formula $(A_kB_l)_n$, where the symbols and indices have the following meanings A are identical or different units

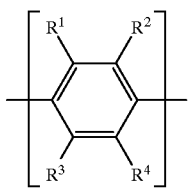

B are identical or different units

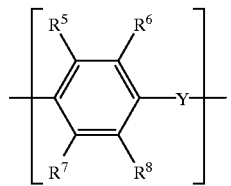

Y are identical or different and are each —C≡C— or —CHR$^{11}$—CHR$^{12}$;

$R^1, R^2, R^3, R^4, R^5, R^6, R^7, R^8, R^{11}, R^{12}$ are, independently of one another, identical or different in the individual structural elements and are each H, a straight-chain or branched alkyl group having from 1 to 22 carbon atoms, where one or more non-adjacent CH$_2$ groups can also be replaced by —O—, —S—, —SO$_2$—, —COOC—, —OOC— and/or phenylene, preferably 1,4-phenylene, or an aryl or aryloxy group, preferably having from 4 to 14 carbon atoms, in which the aromatic unit may be substituted by C$_1$–C$_{22}$-alkyl, C$_1$–C$_{22}$-alkoxy, Br, Cl, F and/or CN, or Br, Cl, F, CN or alkyloxycarbonyl having from 2 to 23 carbon atoms;

k is from 0 to 25;

l is from 0 to 25, where the sum k+l≧1;

n is from 1 to 200, where the sum of all n is in the range from 3 to 200.

7. An electroluminescence device as claimed in claim 5, wherein the polymer used is one in which one or two radicals $R^1, R^2, R^3, R^4$ or $R^5, R^6, R^7, R^8$ are each an alkyl group having from 2 to 22 carbon atoms, where one or more CH$_2$ groups are each replaced by a heteroatom which may be substituted by a further aliphatic or aromatic hydrocarbon radical having from 1 to 22 carbon atoms, and a further CH$_2$ group may be replaced by a substituted or unsubstituted phenylene group and the remaining radicals $R^1$ to $R^8$ are H.

8. An electroluminescence device as claimed in claim 5, wherein the polymer is a block copolymer or a random copolymer.

9. A process for producing an electroluminescence device as claimed in claim 1, which comprises building up the light-emitting layer by means of liquid-gas interface transfer methods.

10. Use of a device as claimed in claim 1 as background lighting for liquid crystal displays.

* * * * *